US009288927B2

(12) United States Patent
Takechi et al.

(10) Patent No.: US 9,288,927 B2
(45) Date of Patent: Mar. 15, 2016

(54) DISPLAY DEVICE

(75) Inventors: Yoshihiro Takechi, Tokyo (JP); Takashi Kanda, Nagaokakyo (JP)

(73) Assignee: NEC DISPLAY SOLUTIONS, LTD., Tokyo (JP)

( * ) Notice: Subject to any disclaimer, the term of this patent is extended or adjusted under 35 U.S.C. 154(b) by 0 days.

(21) Appl. No.: 13/978,376

(22) PCT Filed: Feb. 10, 2011

(86) PCT No.: PCT/JP2011/052891
§ 371 (c)(1),
(2), (4) Date: Jul. 3, 2013

(87) PCT Pub. No.: WO2012/108037
PCT Pub. Date: Aug. 16, 2012

(65) Prior Publication Data
US 2013/0286571 A1    Oct. 31, 2013

(51) Int. Cl.
*H05K 7/04* (2006.01)
*H05K 9/00* (2006.01)
(52) U.S. Cl.
CPC .............. *H05K 7/04* (2013.01); *H05K 9/0054* (2013.01)
(58) Field of Classification Search
CPC ..... H05K 7/04; H05K 9/0054; H05K 7/1447; H05K 7/1448; H05K 7/1449; H05K 7/1452; H05K 7/1459; G06F 1/1637; G06F 1/1656; G06F 1/184
USPC .......... 361/679.01; 174/138 G, 138 D, 138 E, 174/135, 40 CC
See application file for complete search history.

(56) References Cited

U.S. PATENT DOCUMENTS

| | | | | |
|---|---|---|---|---|
| 4,379,536 | A * | 4/1983 | Mizuno et al. | 248/73 |
| 5,949,020 | A * | 9/1999 | Mitchell et al. | 174/40 CC |
| 6,180,886 | B1 * | 1/2001 | Krane et al. | 174/72 A |
| 6,855,890 | B1 * | 2/2005 | Vasichek | 174/135 |
| 7,623,195 | B2 * | 11/2009 | Park et al. | 349/58 |

(Continued)

FOREIGN PATENT DOCUMENTS

| | | |
|---|---|---|
| CN | 1987580 A | 6/2007 |
| CN | 101231800 A | 7/2008 |

(Continued)

OTHER PUBLICATIONS

International Search Report in PCT/JP2011/052891, dated Mar. 8, 2011 (English Translation Thereof).

(Continued)

*Primary Examiner* — Hoa C Nguyen
*Assistant Examiner* — Christopher L Augustin
(74) *Attorney, Agent, or Firm* — McGinn IP Law Group, PLLC.

(57) ABSTRACT

A display device includes: a display monitor; a control board which drives the display monitor; a chassis which is provided between the display monitor and the control board. The chassis includes a conductive material, and has a surface on a side of the display monitor. The display device further includes: a wiring line which is provided along the surface of the chassis; and a clamper which fixes the wiring line to the chassis. The clamper includes a clamp section pressing the wiring line, and leg portions fixed to the chassis. The chassis includes a recessed section at a position where the clamper is fixed. The recessed section is indented towards a side of the control board and accommodating the wiring line.

11 Claims, 6 Drawing Sheets

(56) References Cited

U.S. PATENT DOCUMENTS

| | | | |
|---|---|---|---|
| 7,767,907 B2 * | 8/2010 | Lin et al. | 174/72 A |
| 2009/0242234 A1 * | 10/2009 | Yang | 174/135 |
| 2011/0001734 A1 * | 1/2011 | Kim | 345/204 |
| 2011/0164394 A1 * | 7/2011 | Hwang et al. | 361/818 |

FOREIGN PATENT DOCUMENTS

| | | |
|---|---|---|
| CN | 201170525 Y | 12/2008 |
| CN | 101415307 A | 4/2009 |
| CN | 101782208 A | 7/2010 |
| JP | 3014244 U | 8/1995 |
| JP | 2004-334229 A | 11/2004 |
| JP | 2005-019726 A | 1/2005 |
| JP | 2007-250683 A | 9/2007 |
| JP | 2008-197579 A | 8/2008 |
| JP | 2009-016190 A | 1/2009 |
| JP | 2009-044503 A | 2/2009 |
| JP | 2010-002818 A | 1/2010 |

OTHER PUBLICATIONS

Chinese Office Action dated May 5, 2015 with English translation.

\* cited by examiner

Prior Art

DISPLAY DEVICE

TECHNICAL FIELD

The present invention relates to a display device such as a monitor.

BACKGROUND ART

A display device such as a monitor has a structure in which a display monitor such as a liquid crystal panel, a chassis formed of a sheet-metal provided on the rear surface thereof, and a control board that performs drive control and the like of the display monitor are stacked.

As shown in FIG. 6A and FIG. 6B, wiring lines 1 connected to an electric circuit on the control board via a connector, are positioned and fixed to a chassis 2 by a member referred to as clamper 3.

The clamper 3 has a portal shape, and includes leg portions 3a respectively fitted in an insertion hole 4 formed in the chassis 2, on the opposite ends thereof. An engagement protrusion 5 is provided on the leg portion 3a, and the engagement protrusion 5 engages with the periphery of the insertion hole 4 on the rear surface side of the chassis 2, thereby preventing the leg portion 3a from coming out from the insertion hole 4.

However, as shown by the two-dot chain line in FIG. 6B, when the number of wiring lines 1 fixed by one clamper 3 is large, a bar-like holding member 6 of the clamper 3 may deform in a direction away from the surface of the chassis 2, which hinders downsizing and thickness reduction of the display device required all the time.

On the other hand, in a wiring line positioning member described in Patent Document 1, it has been proposed that the positioning and holding of wiring lines is performed without using a clamper, by providing a groove or a gap in a substrate and passing the wiring lines through it.

PRIOR ART DOCUMENT

Patent Document

Patent Document 1: Japanese Unexamined Patent Application, First Publication No. 2005-19726

SUMMARY OF THE INVENTION

Problems to be Solved by the Invention

However, the chassis of the display device also has a function as an electromagnetic shield. Accordingly, if an opening such as a groove or gap is formed in the chassis, there is a problem in that the electromagnetic shield effect decreases.

Further, at the time of machining the opening by pressing or the like, burrs may be generated. Due to these burrs, an insulating film of the wiring line may be removed, and hence the chassis and the wiring lines may be electrically short-circuited.

The present invention has been conceived in view of the above situation, and an object thereof is to provide a display device that can fix wiring lines safely and reliably, while ensuring the electromagnetic shield effect, without hindering thickness reduction of the display device.

Means for Solving the Problem

In the display device according to the present invention, a display monitor, a plate-like chassis which includes a conductive material, and a control board which drives the display monitor are stacked, a wiring line is provided along a surface of the chassis on a side of the display monitor, the wiring line is fixed by a clamper which includes a clamp section pressing the wiring line, and leg portions fixed to the chassis, a recessed section which is indented towards a side of the control board and accommodates the wiring line, is formed in the chassis at a position where the clamper is fixed.

According to the present invention, the wiring line enters into the recessed section at the position where the wiring line is fixed to the chassis by the clamper. Accordingly, the protruding height of the clamper from the chassis can be reduced. Moreover, by forming the recessed section without forming a through hole in the chassis, the electromagnetic shield effect of the chassis can be maintained, and burrs or the like are not generated at the time of machining.

Furthermore, it is preferable that a protruding height of the recessed section of the chassis toward the side of the control board is equal to or smaller than a protruding height of the leg portions of the clamper protruding from an insertion hole of the chassis toward the control board side and engaged.

Accordingly, it can be avoided that the chassis becomes thick due to the formation of the recessed section.

Moreover, the shape of the recessed section may be any shape. For example, the recessed section may be have a rectangular shape in plan view, and have a long side in a direction in which the wiring line runs.

Accordingly, the curvature of the wiring line that is pressed in by the clamper to enter into the recessed section becomes gradual, thereby reducing the load on the wiring line.

Effect of the Invention

According to the present invention, the wiring line can be made to enter into the recessed section formed in the chassis at the position where the wiring line is fixed to the chassis by the clamper. Hence, the protruding height of the clamper from the chassis can be suppressed and hindering of thickness reduction of the display device can be avoided.

Moreover, the electromagnetic shield effect of the chassis can be ensured by forming the recessed section without forming a through hole or the like in the chassis. Furthermore, the non-penetrating recessed section does not generate burrs or the like at the time of machining, thus preventing damage to the insulating film of the wiring line, and the wiring line can be fixed safely and reliably.

EMBODIMENTS FOR CARRYING OUT THE INVENTION

Best embodiments for carrying out a display device according to the present invention will be explained with reference to the accompanying drawings. However, the present invention is not limited to these embodiments.

Figure 1:
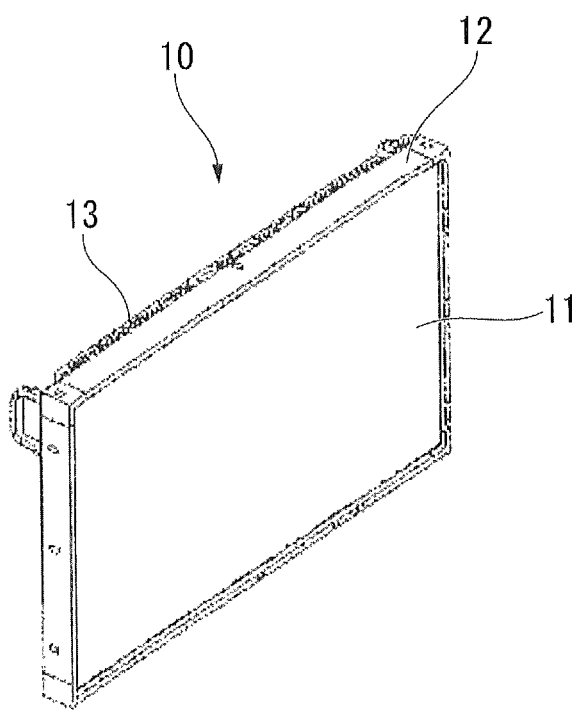
FIG. 1 is a perspective view showing a display device according to an embodiment of the present invention.
Figure 2:
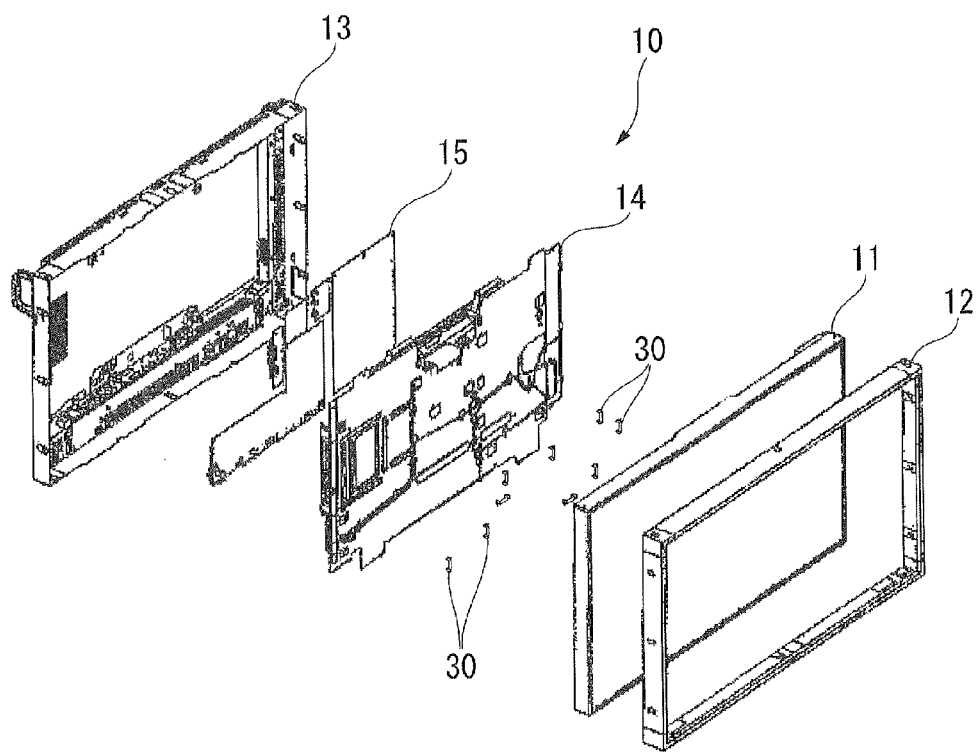
FIG. 2 is an exploded perspective view showing an internal configuration of the display device shown in FIG. 1.

As shown in FIG. 1 and FIG. 2, a framework of a display device 10 is formed by a display monitor 11 that displays information such as an image or a video picture, a front cover 12 provided on an outer periphery of the display monitor 11, and a back cover 13 that covers a rear surface of the display device 10.

As shown in FIG. 2, a chassis 14 and a control board 15 are stacked between the display monitor 11 and the back cover 13.

Figure 3:
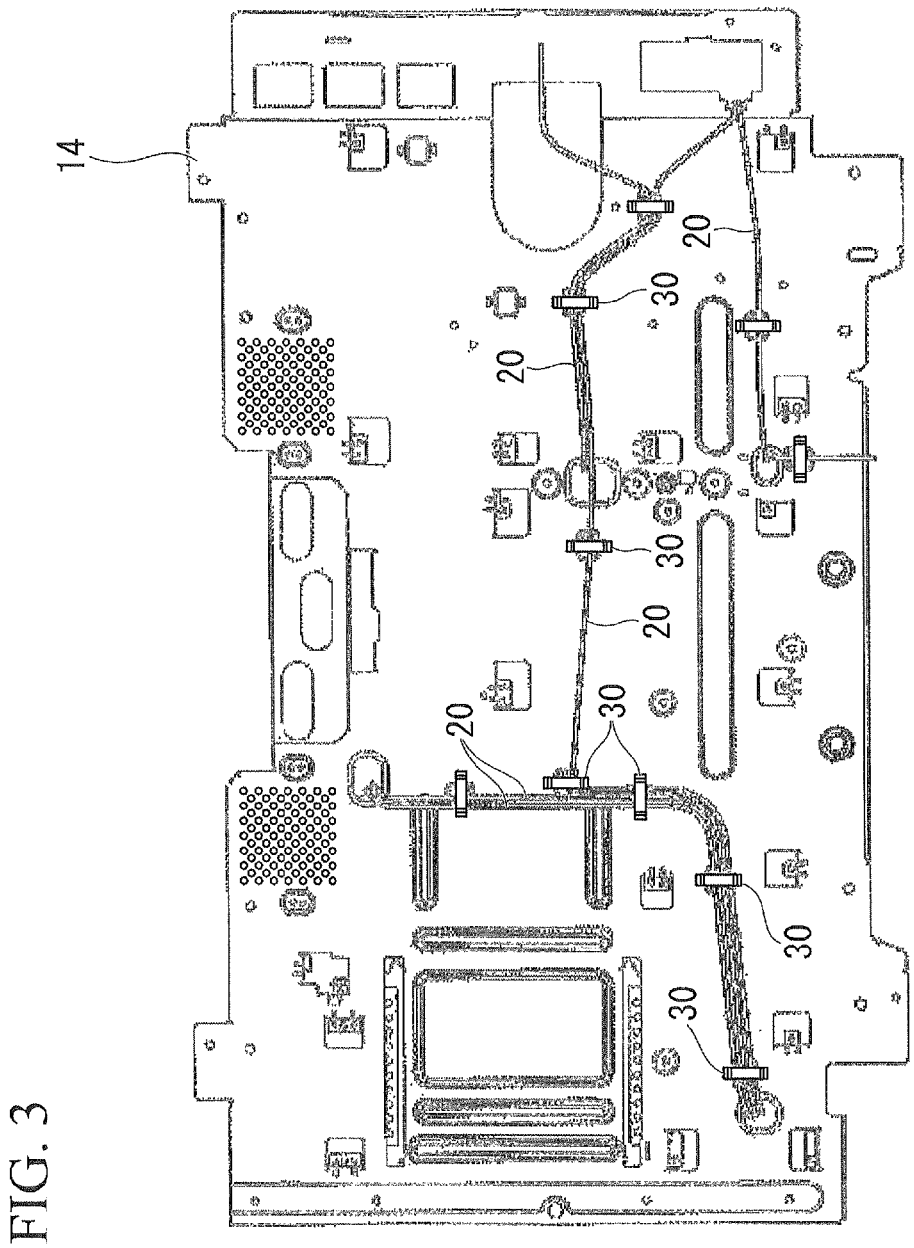
FIG. 3 is a front view of a chassis.

As shown in FIG. 3, wiring lines 20 are arranged along the surface of the chassis 14, with one end connected to components mounted on the chassis 14, an electric circuit on the control board 15, and the like via a connector (not shown). The number of wiring lines 20 or the arrangement layout thereof is not limited.

The wiring lines 20 are positioned on and fixed to the chassis 14 by clampers 30.

Figure 4A:
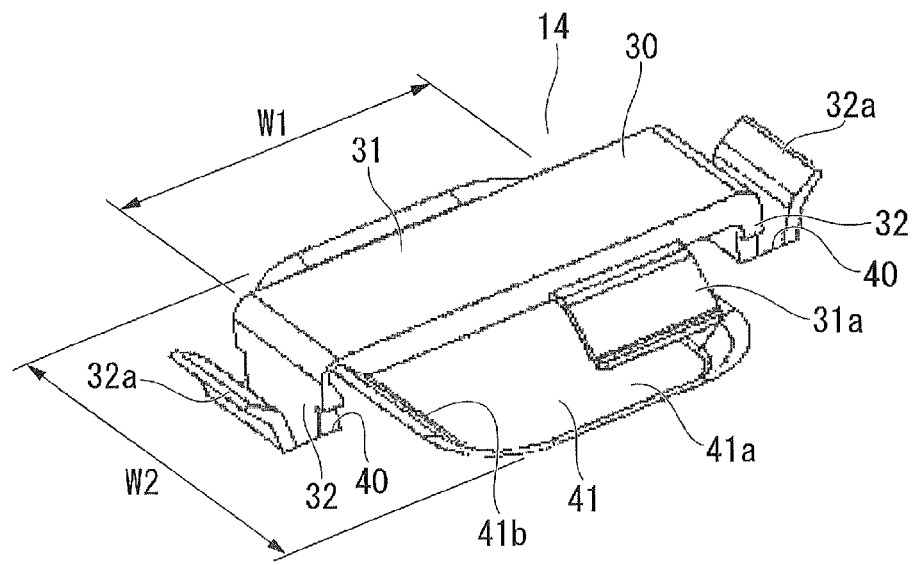
FIG. 4A is a perspective view of a relevant part in a state with a clamper mounted on the chassis.
Figure 4B:
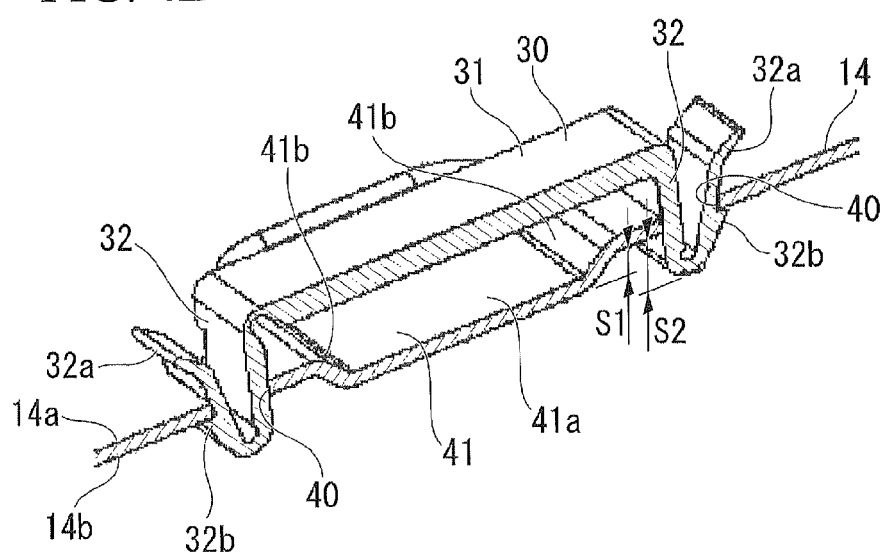
FIG. 4B is a sectional view along a longitudinal direction of a clamp bar in the state with the clamper mounted on the chassis.

As shown in FIGS. 4A and 4B, the clamper 30 has a portal shape, and includes a bar-like clamp bar (clamp section) 31 extending in one direction, and leg portions 32, 32 respectively extending from the opposite ends of the clamp bar 31.

A pressing plate 31a protruding in a direction orthogonal to the direction in which the clamp bar 31 runs is formed on the clamp bar 31.

End portions 32a of the respective leg portions 32 are folded back substantially in a J shape. An engagement protrusion 32b protruding outward, is formed on the end portion 32a of the leg portion 32.

Meanwhile, insertion holes 40 for inserting the leg portions 32 of the clamper 30, are formed in the chassis 14 at predetermined positions.

The leg portions 32 of the clamper 30 are inserted into the insertion holes 40. By so doing, the end portions 32a of the leg portions 32 folded back substantially in the J shape interfere with the insertion holes 40 to elastically deform inward. Then when the engagement protrusions 32b pass through the insertion holes 40 to reach the rear surface side of the chassis 14, the end portions 32a of the leg portions 32 having elastically deformed inward are restored outward, and the engagement protrusions 32b are pushed toward the peripheries of the insertion holes 40 to engage with them. Accordingly, the clamper 30 is fixed to the chassis 14.

A bottom surface 41a of the recessed section 41 is made to be a flat surface, and an edge area of the recessed section 41 is made to be an inclined surface 41b having a mortar shape. Here, a protruding dimension S1 of the bottom surface 41a from a rear surface 14b of the chassis 14 is formed so as to be smaller than a protruding dimension S2 of the leg portion 32 of the clamper 30 from the rear surface 14b of the chassis 14.

In the chassis 14, a recessed section 41 is formed between the insertion holes 40. The recessed section 41 is for accommodating the wiring lines 20.

A bottom surface 41a of the recessed section 41 is made to be a flat surface, and an edge area of the recessed section 41 is made to be an inclined surface 41b having a mortar shape. Here, a protruding dimension S1 of the bottom surface 41a from a rear surface 14b of the chassis 14 is formed so as to be smaller than a protruding dimension S2 of the leg portion 32 of the clamper 30 from the rear surface 14b of the chassis 14.

The recessed section 41 is formed such that a dimension W2 thereof in a direction orthogonal to a direction connecting the insertion holes 40 is larger than a dimension W1 thereof in the direction connecting the insertion holes 40.

Figure 5A:
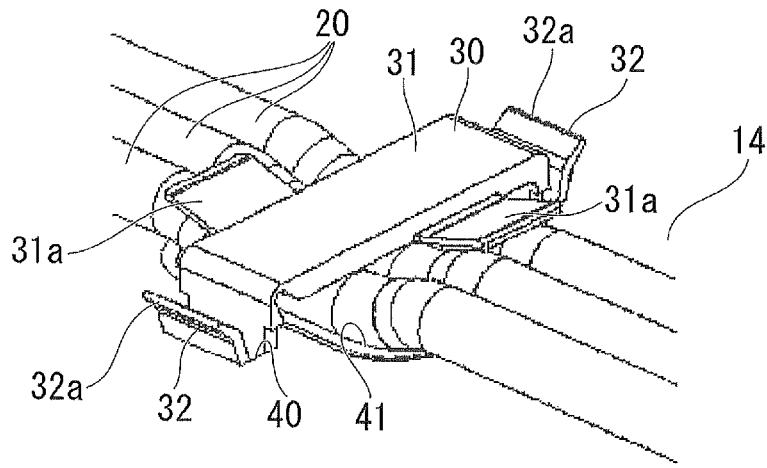
FIG. 5A is a perspective view in a state with wiring lines fixed by the clamper.
Figure 5B:
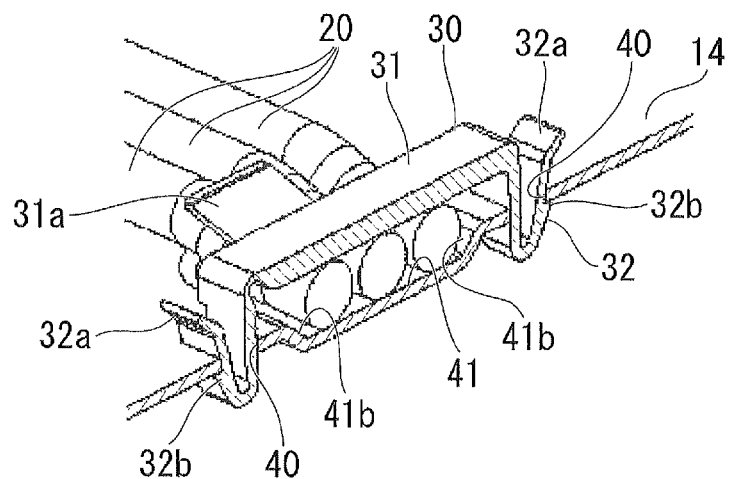
FIG. 5B is a sectional view in a direction orthogonal to an axis of the wiring line, in the state with wiring lines fixed by the clamper.
Figure 5C:
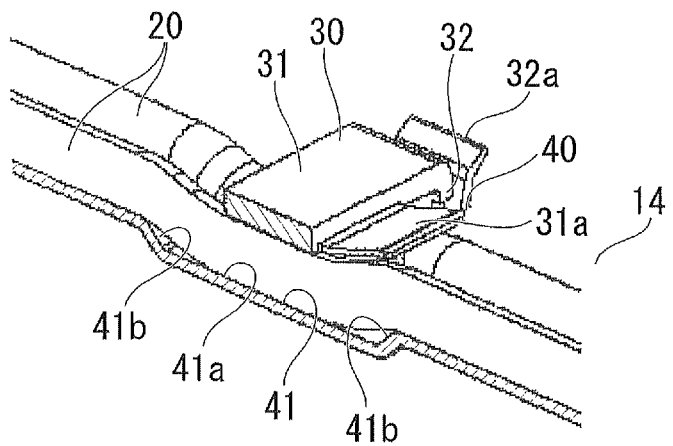
FIG. 5C is a sectional view in the direction along the axis of the wiring line, in the state with wiring lines fixed by the clamper.
Figure 6A:
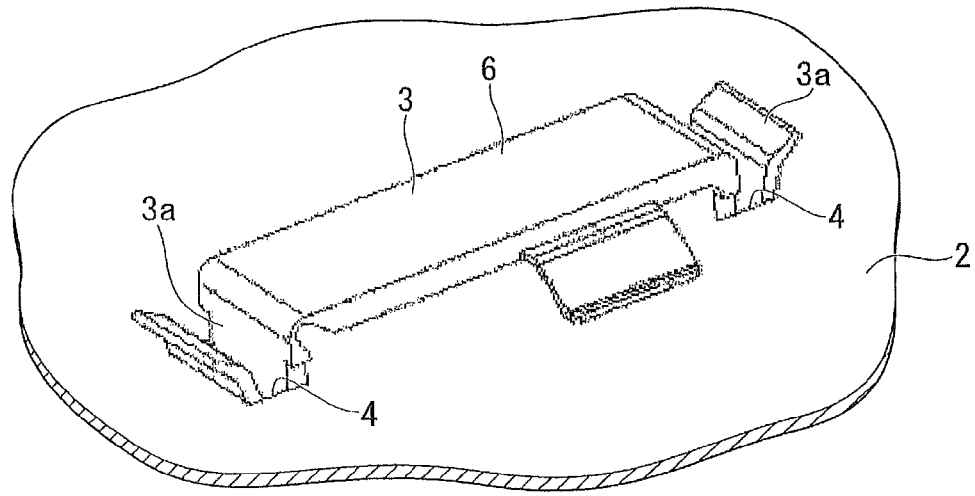
FIG. 6A shows a conventional fixing structure for wiring lines using a clamper, in a state with the clamper mounted on a chassis.
Figure 6B:
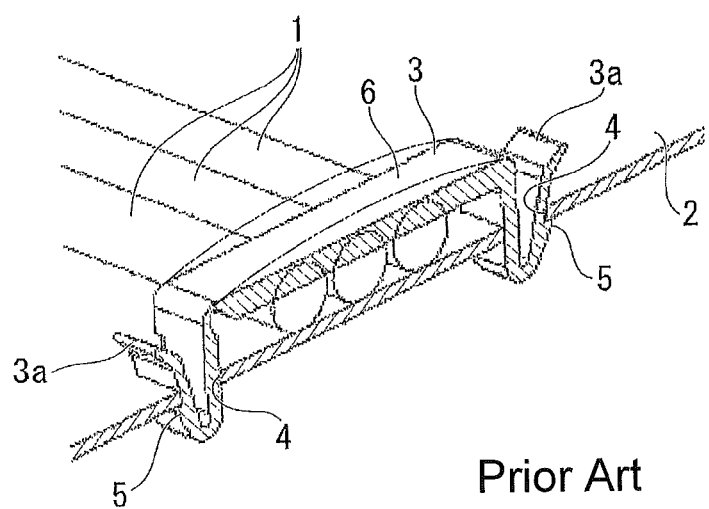
FIG. 6B is a sectional view of FIG. 6A.

As shown in FIGS. 5A, 5B, and 5C, the wiring lines 20 can be inserted between the recessed section 41 and the clamp bar 31 of the clamper 30. The wiring line 20 enters into the recessed section 41 and is pressed down by the clamp bar 31. Moreover, the pressing plate 31a of the clamp bar 31 can deform elastically, and presses down the wiring line 20 accommodated in the recessed section 41 by a biasing force thereof.

As described above, according to the display device 10 of the present embodiment, the recessed section 41 is formed at the position where the wiring lines 20 are fixed by the clamper 30, and accommodates the wiring lines 20 in the recessed section 41, thereby enabling to lower the position of the clamp bar 31 from a surface 14a of the chassis 14. On the other hand, the recessed section 41 is formed such that the protruding dimension S1 of the bottom surface 41a from the rear surface 14b of the chassis 14 is smaller than the protruding dimension S2 of the leg portion 32 of the clamper 30 from the rear surface 14b of the chassis 14. Hence, the substantive thickness of the chassis 14 is not increased by the recessed section 41.

Consequently, the wiring lines 20 can be reliably fixed by the clamper 30 without hindering thickness reduction of the display device 10.

Moreover, because the recessed section 41 is non-penetrating, having no penetrating slit or hole, it does not damage the electromagnetic shield effect. Furthermore, because burrs due to machining are not generated, the wiring line 20 can be safely fixed without damaging the insulating film of the wiring line 20.

Moreover, the recessed section 41 is a rectangular shape having a long side in a direction in which the wiring line runs. Therefore the curvature of the wiring line 20 that is pressed in by the clamper 30 to enter into the recessed section 41 becomes gradual, thereby reducing the load on the wiring line.

The display device according to the present invention is not limited to the respective embodiments described above with reference to the drawings, and various modifications can be made without departing from the scope of the present invention.

For example, the shape of the clamper 30 is not limited to the shape described above, and any shape and any material may be used.

Moreover, the wiring line 20 can be of any type.

Furthermore, the protruding height of the recessed section 41 toward the control board 15 side is not limited to the height equal to or smaller than the protruding height of the leg portion 32 of the clamper 30, and may be a height equal to or smaller than the height of other members or components that protrude toward the control board 15 side of the chassis 14.

Moreover, the configurations of the display monitor 11, the front cover 12, the back cover 13, the chassis 14, the control board 15, and the like may be any configuration that does not depart from the scope of the present invention.

Furthermore, the configurations described in the above embodiments may be selected or may be appropriately changed to other configurations, without departing from the scope of the present invention.

INDUSTRIAL APPLICABILITY

In the display device such as a monitor according to the present invention, the wiring lines provided along the chassis incorporated therein are entered into the recessed section formed in the chassis in an area fixed by the clamper. As a result, the wiring lines can be fixed safely and reliably, without hindering thickness reduction of the display device, while ensuring the electromagnetic shield effect.

REFERENCE SYMBOLS

10 Display device
11 Display monitor
12 Front cover
13 Back cover
14 Chassis
15 Control board
20 Wiring line
30 Clamper
31 Clamp bar (clamp section)
31a Plate
32 Leg portion
32a End portion
32b Engagement protrusion
40 Insertion hole
41 Recessed section
41a Bottom surface
41b Inclined surface

The invention claimed is:

1. A display device, comprising:
a display monitor;
a control board which drives the display monitor;
a wiring line;
a chassis which is provided between the display monitor and the control board, the chassis including a conductive material, the chassis including a first surface and a second surface on an opposite side from the first surface, the first surface contacting with the wiring line provided along the first surface; and
a clamper which fixes the wiring line to the chassis, the clamper including a clamp section pressing the wiring line, and leg portions fixed to the chassis,
the first surface of the chassis including a recessed section provided at a position where the clamper is fixed, the recessed section being indented toward the second surface of the chassis, and the recessed section accommodating the wiring line, and
the recessed section including a bottom surface and an inclined surface provided at an edge of the bottom surface, the inclined surface being inclined with respect to the bottom surface.

2. The display device according to claim 1, wherein a protruding height of the recessed section of the chassis toward a side of the control board is equal to or smaller than a protruding height of the leg portions of the clamper protruding from an insertion hole of the chassis toward a control board side and engaged.

3. The display device according to claim 1, wherein the recessed section has a rectangular shape in a plan view, and includes a long side in a direction in which the wiring line runs.

4. The display device according to claim 1, wherein the first surface of the chassis faces the display monitor, and the second surface of the chassis faces the control board.

5. The display device according to claim 1, wherein the wiring line includes a plurality of wiring lines each having a circular shape in section.

6. The display device according to claim 1, wherein the first surface further includes insertion holes disposed on opposing sides of the recessed section for inserting the leg portions into the insertion holes.

7. The display device according to claim 1, wherein, in a direction from the display monitor to the control board, the recessed section is indented toward the control board.

8. The display device according to claim 1, wherein the clamper further comprises a pressing plate protruding in a direction orthogonal to a lateral direction of the clamp section to press the wiring line by a biasing force.

9. The display device according to claim 1, wherein end portions of the leg portions are folded back in a J shape, and engagement protrusions, protruding outward, are formed on the end portions of the leg portions.

10. The display device according to claim 1, wherein the bottom surface of the recessed section includes a flat surface, and the inclined surface has a mortar shape for insertion of the wiring line.

11. The display device according to claim 1, wherein a protruding length of the bottom surface from a rear surface of the chassis is less than a protruding length of the leg portions of the clamper from the rear surface of the chassis.

* * * * *